(12) United States Patent
Nagao et al.

(10) Patent No.: US 6,787,700 B2
(45) Date of Patent: Sep. 7, 2004

(54) STRUCTURE OF JOINING CHIP PART TO BUS BARS

(75) Inventors: Masashi Nagao, Shizuoka (JP); Hisafumi Maruo, Shizuoka (JP); Norihito Suzuki, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 36 days.

(21) Appl. No.: 10/270,490

(22) Filed: Oct. 16, 2002

(65) Prior Publication Data

US 2003/0073349 A1 Apr. 17, 2003

(30) Foreign Application Priority Data

Oct. 16, 2001 (JP) ..................................... P2001-318133

(51) Int. Cl.$^7$ ........................ H01L 23/52; H01L 23/495
(52) U.S. Cl. ...................... 174/52.1; 257/676; 257/691
(58) Field of Search .............................. 174/52.1, 52.3, 174/52.4; 257/673, 676, 690, 691, 734, 735; 361/743, 767, 768, 772

(56) References Cited

U.S. PATENT DOCUMENTS 3,429,040 A * 2/1969 Miller ......................... 29/840
5,196,726 A * 3/1993 Nishiguchi et al. ......... 257/737
5,311,405 A * 5/1994 Tribbey et al. ............. 361/767
6,200,143 B1 * 3/2001 Haba et al. .................... 439/70

FOREIGN PATENT DOCUMENTS

JP 2001053432 A * 2/2001 ............ H05K/3/34

* cited by examiner

Primary Examiner—Dean A. Reichard
Assistant Examiner—Carmelo Oliva
(74) Attorney, Agent, or Firm—Sughrue Mion, PLLC

(57) ABSTRACT

A chip part (6) is mounted on bus bars (2, 3), and connection portions (6t) of the chip part (6) are soldered to the bus bars (2, 3), respectively. At this time, recesses (10, 11) are beforehand formed respectively in soldering lands of the two spaced-apart bus bars each corresponding to a predetermined solder wetting area. The chip part is soldered to the bus bars in such a manner that the connecting portions are spaced apart from inner edges of these recesses, respectively, thereby forming a solder fillet between at least part of each of the recesses and the corresponding connecting portion of the chip part.

10 Claims, 3 Drawing Sheets

STRUCTURE OF JOINING CHIP PART TO BUS BARS

BACKGROUND OF THE INVENTION

This invention relates to a structure of joining, to bus bars, a chip part connected to an electronic device to be mounted on a circuit board, a J/B (junction box) or the like,.

As shown in FIG. 5, when chip parts 21, 22 and 23 of an electronic device 20 are soldered to bus bars (bar-like metallic conductors) 25, 26, 27 and 28, the chip parts 21, 22 and 23 are placed on soldering lands 25a, 26a, 27a and 28a (indicated in dots-and-dash lines in the drawings) of two or more (four in the illustrated example) bus bars 25, 26, 27 and 28. Then, connecting portions 21t, 22t and 23t of the thus placed chip parts 21, 22 and 23 are joined by soldering to the corresponding bus bars 25, 26, 27 and 28, respectively.

More specifically, in the soldering operation, when molten solder is dropped and supplied to be coated onto each connecting portion 21t, 22t, 23t of the chip part 21, 22, 23 and the associated soldering land 25a, 26a, 27a, 28a of the bus bar 25, 26, 27, 28, the molten solder forms a wide wetting area on the surface of the bus bar, and is solidified. This solder-solidified condition is shown in FIG. 6 which is a cross-sectional view taken along the line VI—VI of FIG. 5. In FIG. 6, the showing of a board 29 (shown in FIG. 5) is omitted.

However, the solder 30 assumes a thin film-like configuration as a whole because of its wide wetting area, and will not form any solder fillet. As a result, there has been encountered a problem that the solder joint strength is insufficient, so that the reliability of the solder joint is lowered.

In order to solve this problem, there has been proposed a method in which spot-plating of metal, having excellent solder wetting properties, is applied to the soldering land 25a, 26a, 27a, 28a of each bus bar 25, 26, 27, 28 so that the wetting area of the soldering land 25a, 26a, 27a, 28a is limited to a narrow range. However, this method has a problem that the production efficiency is lowered, so that the production cost greatly increases.

SUMMARY OF THE INVENTION

This invention seeks to solve the above problems, and an object of the invention is to provide a structure of joining a chip part to bus bars, in which the sufficient solder joint strength is obtained without increasing the cost, while ensuring the production efficiency, so that the solder joint of high reliability can be achieved.

In order to solve the aforesaid object, the invention is characterized by having the following arrangement.

(1) A joining structure comprising:
  two conductive bus bars spaced from each other;
  a chip part including connecting portions for an electric circuit, mounted on the two bus bars;
  recesses formed in soldering lands of the two bus bars, respectively, so that the connecting portions are spaced apart from inner edges of the recesses; and
  a solder fillet formed between at least part of each of the recesses and the corresponding connecting portion.
(2) The joining structure according to (1), wherein the connecting portions has a flat plate-like shape on opposite side surfaces of the chip part, and the connecting portions form a part of a bottom surface of the chip part.
(3) The joining structure according to (1), wherein bottom surfaces of the connecting portions extend inwardly toward each other.
(4) The joining structure according to (1), wherein
  each of the recesses includes a flat bottom surface, and
  the solder fillets are formed in a state that lower surfaces of the connecting portions are held by the bottom surface.
(5) The joining structure according to (1), wherein
  the solder fillets are formed in a state that the connecting portions are spaced from a bottom surfaces of the recesses, so that a solder layer is formed between the bottom surfaces and a lower surface of the connecting portion.
(6) The joining structure according to (1), wherein
  each of the recesses includes a projection platform having a height lower than an upper surface of the bus bars, and
  the solder fillets are formed in a state that lower surfaces of the connecting portions are held by the projection platforms, respectively.
(7) The joining structure according to (1), wherein the soldering lands correspond to a predetermined solder wetting area.

DETAILED DESCRIPTION OF PREFERRED EMBODIMENTS

Figure 1:
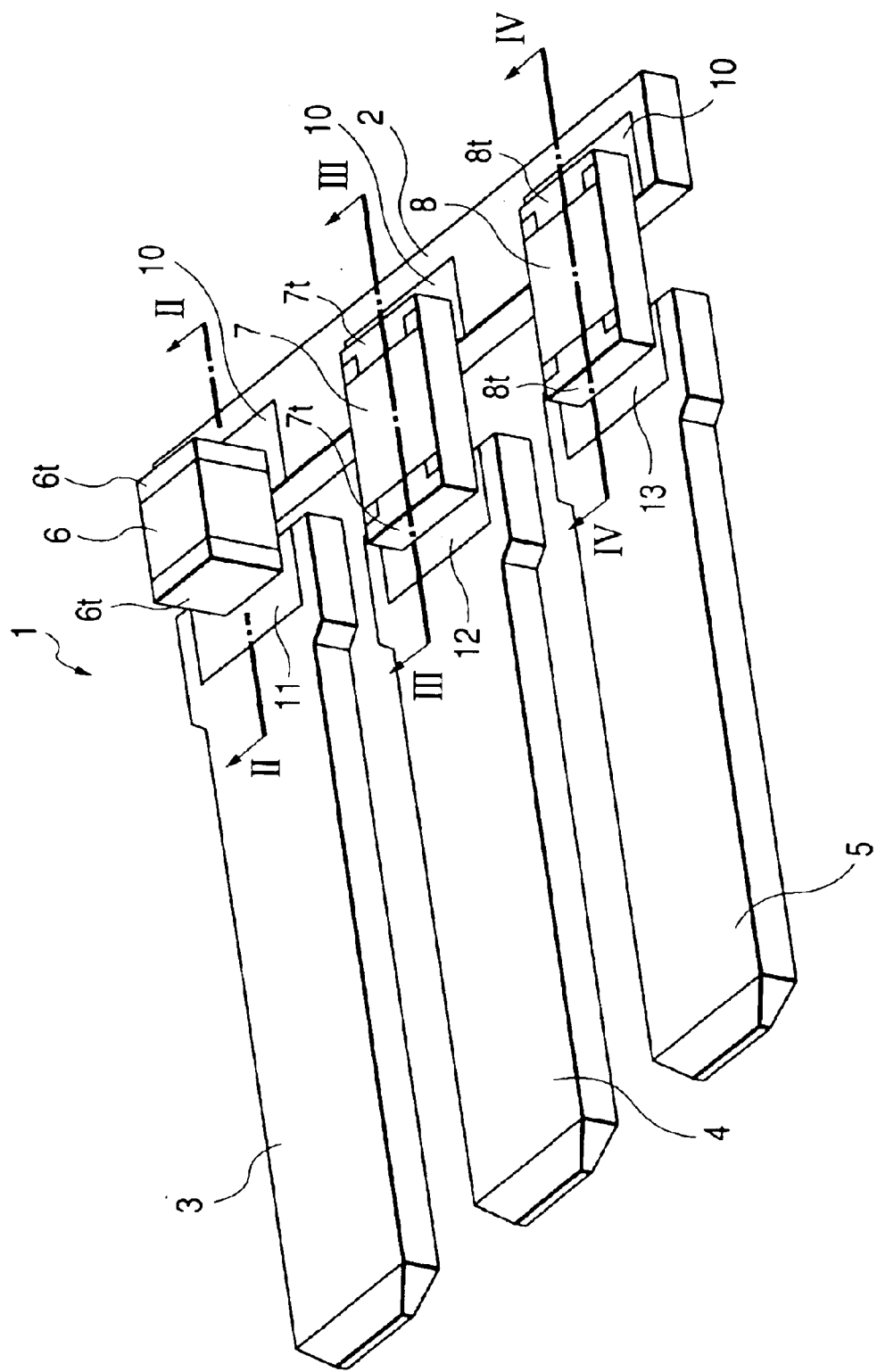
FIG. 1 is a perspective view of bus bars and chip parts, showing a condition immediately before the solder joint is effected in a structure of the invention for joining the chip parts to the bus bars.
Figure 2:
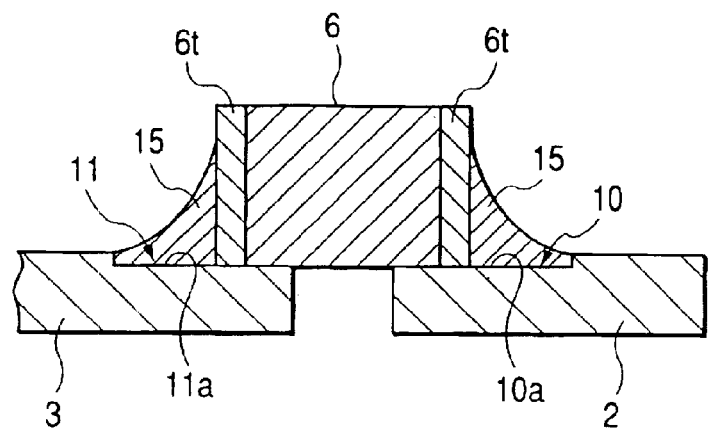
FIG. 2 is a cross-sectional view of the chip part and the bus bars soldered thereto taken along the line II—II of FIG. 1.
Figure 3:
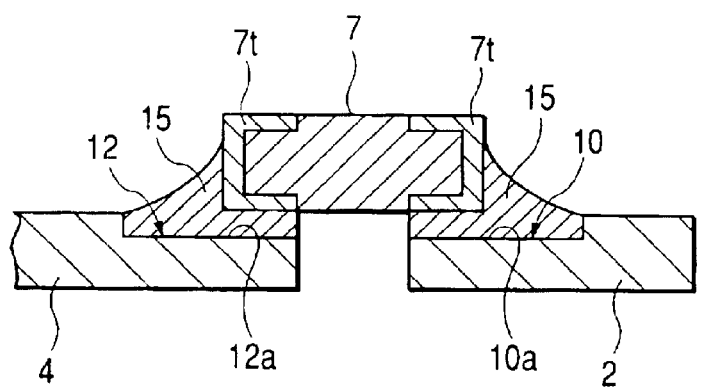
FIG. 3 is a cross-sectional view of the chip part and the bus bars soldered thereto taken along the line III—III of FIG. 1.
Figure 4:
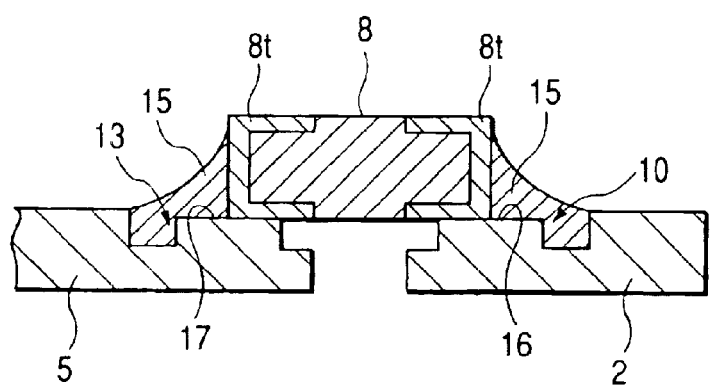
FIG. 4 is a cross-sectional view of the chip part and the bus bars soldered thereto taken along the line IV—IV of FIG. 1.
Figure 5:
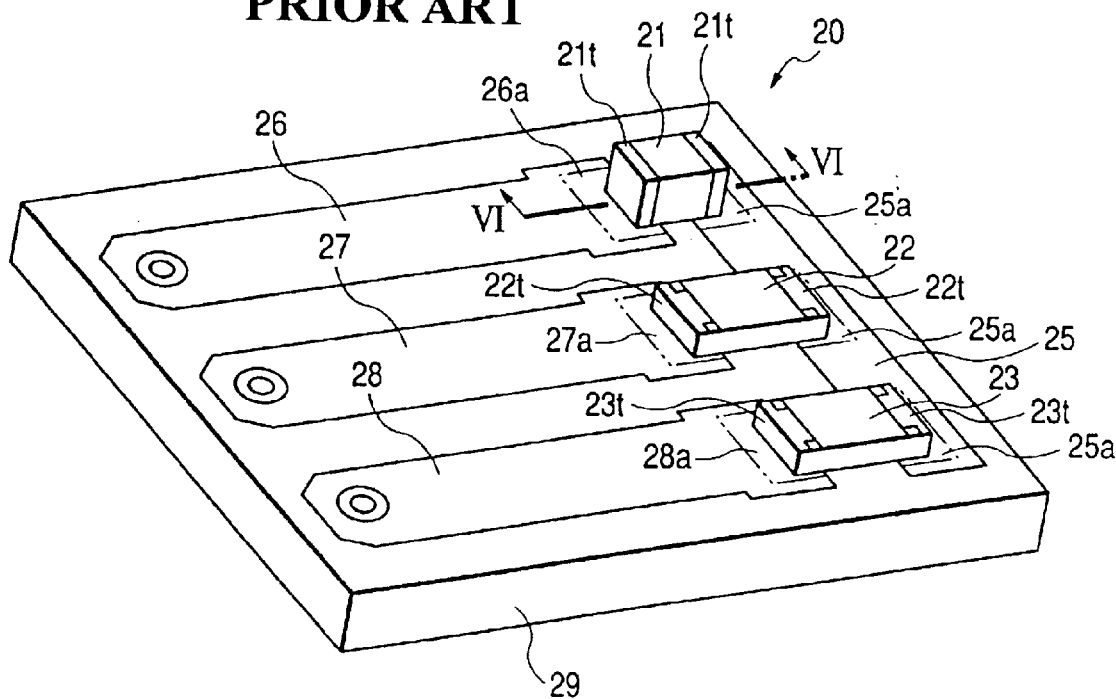
FIG. 5 is a perspective view of a conventional assembly in which chip parts are soldered to bus bars.
Figure 6:
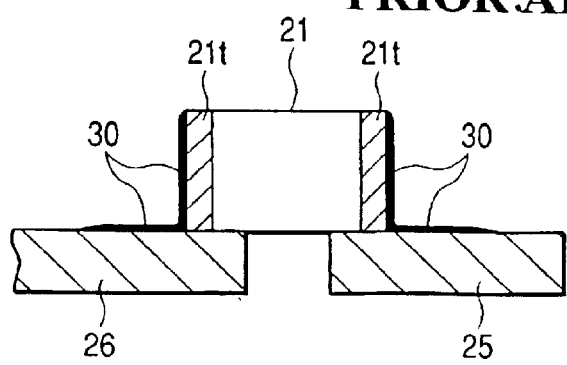
FIG. 6 is a cross-sectional view of the chip part and the bus bars soldered thereto taken along the line VI—VI of FIG. 5.

A structure of joining chip parts to bus bars, according to one preferred embodiment of the invention, will now be described in detail with reference to FIGS. 1 to 4. FIG. 1 is a perspective view of bus bars and chip parts, showing a condition immediately before the solder joint is effected in the structure of this embodiment for joining the chip parts to the bus bars, FIG. 2 is a cross-sectional view of the chip part and the bus bars (soldered thereto) taken along the line II—II of FIG. 1, FIG. 3 is a cross-sectional view of the chip part and the bus bars (soldered thereto) taken along the line III—III of FIG. 1, and FIG. 4 is a cross-sectional view of the chip part and the bus bars (soldered thereto) taken along the line IV—IV of FIG. 1.

The structure of this embodiment for joining the chip parts to the bus bars will be described, taking an electronic device as an example as shown in FIG. 1. In this electronic device 1, the chip parts, such as a resistor and a capacitor, are soldered, and this electronic device 1 is a semi-assembly in which a terminal resistor circuit to be provided at an end of a bus line, installed on an automobile or the like, is formed into a compact, chip-like configuration.

In the illustrated embodiment, the electronic device 1 comprises four bus bars 2, 3, 4 and 5, and the juxtaposed bus bars 3, 4 and 5 are disposed to perpendicularly intersect the bus bar 2, and these bus bars are spaced from one another. The bus bars 2 to 5 are formed from metal (such as a copper alloy), having excellent solder wetting properties, by blanking.

Namely, the bus bar 2 is used as a common bus bar. The chip part 6 is mounted on the bus bars 2 and 3 in a bridging manner, the chip part 7 on the bus bars 2 and 4, and the chip part 8 on the bus bars 2 and 5. Thus, a total of three chip parts are mounted.

The chip parts 6 to 8 are a capacitor, a resistor, a diode and other parts. In the illustrated embodiment, the chip part 6 is a capacitor, and the chip parts 7 and 8 are resistors, respectively.

Each of the chip parts 6 to 8 includes connecting portions 6*t*, 7*t*, 8*t* exposed respectively toward the bus bar 2 and the bus bar 3, 4, 5. The connecting portions 6*t*, 7*t*, 8*t* are joined by soldering to a corresponding soldering land of the bus bar 2 and a soldering land of the bus bar 3, 4, 5. The connecting portions 6*t*, 7*t*, 8*t* are provided respectively at opposite sides of the chip part 6, 7 and 8, and have a flat plate-like shape. Lower surfaces of the connecting portions 6*t*, 7*t*, 8*t*, opposed respectively to the bus bar 2 and the bus bar 3, 4, 5, form part of a lower surface of the chip part 6, 7, 8. The lower surfaces of the connecting portions 6*t*, 7*t*, 8*t* extend inwardly toward each other in opposed relation to each other respectively from the opposite sides of the chip part 6, 7, 8. Preferably, at least the surface of each connecting portion 6*t*, 7*t*, 8*t* is made of a copper alloy having excellent solder wetting properties.

In the structure of this embodiment for joining the chip parts to the bus bars, recesses 10, 11, 12 and 13 are beforehand formed in the soldering lands of the bus bars 2 to 5, respectively. Three recesses 10, corresponding respectively to the recesses 11, 12 and 13, are formed in the bus bar 2. The recesses 10 to 13 provide respective regions corresponding to respective predetermined solder wetting areas (i.e., desired proper solder wetting areas). These recesses 10 to 13 can be formed easily and precisely, for example, by pressing in the same time of molding the bus bars 2 to 5. Therefore, the efficiency of production of the bus bar structure can be kept high, thereby preventing the increase of the cost.

Then, the connecting portions 6*t*, 7*t*, 8*t* of each chip part 6, 7, 8 are located respectively at the recess 10 and the recess 11, 12, 13 in such a manner that the connecting portions 6*t*, 7*t*, 8*t* are spaced apart from an inner edge of the recess 10 and an inner edge of the recess 11, 12, 13, respectively. In this condition, molten solder is dropped and supplied to a gap between each connecting portion 6*t*, 7*t*, 8*t* and the corresponding recessed portion 10, 11, 12, 13. This molten solder is solidified, so that the chip part 6, 7, 8 is soldered to the bus bar 2 and the bus bar 3, 4, 5 through the connecting portions 6*t*, 7*t*, 8*t* and the recess 10 and the recess 11, 12, 13.

At this time, the amount of dropping of the molten solder is suitably controlled so as to form a solder fillet (fillet-like solder) between at least part of the recess 10, 11, 12, 13 and the connecting portion 6*t*, 7*t*, 8*t* of the chip part 6, 7, 8. Namely, this amount is so controlled that the molten solder cab fill in the gap between the recessed portion 10, 11, 12, 13 and the connecting portion 6*t*, 7*t*, 8*t*, and can form the fillet.

As a result, the inner edge of the recess 10, 11, 12, 13 prevents the molten solder from flowing out of the recess, and therefore the molten solder will not spread beyond the inner edge of the recess 10, 11, 12, 13, thus preventing the wetting area from increasing outwardly.

Therefore, the solder joint strength of the chip parts 6 to 8, each having the fillets formed thereon, is markedly increased, so that the reliability of the solder joint can be greatly enhanced. Details of the solidified fillets will be described with reference to FIGS. 2 to 4 in the following.

With respect to the joint form of the solder 15 shown in FIG. 2, bottom surfaces 10*a* and 11*a* of the recesses 10 and 11 are flat, and the lower surfaces of the flat plate-like connecting portions 6*t* of the chip part 6 are held against these bottom surfaces 10*a* and 11*a*, respectively, and in this condition the fillets of the solder 15 are formed.

The lower surfaces of the connecting portions 6*t*, disposed respectively in the recesses 10 and 11, form part of the bottom surface of the chip part 6. This joint form of the solder 15 can be applied to the other chip parts 7 and 8 shown in FIG. 1.

With respect to the joint form of the solder 15 shown in FIG. 3, the connecting portions 7*t* are spaced respectively from bottom surfaces 10*a* and 12*a* (similar respectively to the bottom surfaces 10*a* and 11*b* in FIG. 2), and in this condition the fillets of the solder 15 are formed. The lower surface portions of the connecting portions 7*t* extend inwardly toward each other in opposed relation to each other respectively from the opposite sides of the chip part 7. Therefore, in this joint form, a relatively-wide layer of solder 15 can be formed between the bottom surface 10*a*, 12*a* and the lower surface of the connecting portion 7*t*.

In this case, the solder joint strength is further increased. It is particularly effective to use the chip part having connecting portions whose lower surface portions are similar to that of the connecting portion 7*t*. This solder joint form can be applied to the other chip parts 6 and 8 shown in FIG. 1.

With respect to the joint form of the solder 15 shown in FIG. 4, projection-like platforms 16 and 17, each having a height lower than the upper surface of the bus bar 2, 5, are formed respectively within the recesses 10 and 13, that is, formed respectively on outer portions of bottom surfaces of the recesses 10 and 13, and the lower surfaces of the connecting portions 8*t* of the chip part 8 are held against the platforms 16 and 17, respectively, and in this condition the fillets of the solder 15 are formed.

The connecting portions 8*t* includes their respective lower surface portions similar to those of the connecting portions 7*t*. The outer portions of the recesses 10 and 13 mean those portions of the bus bars 2 and 5 close to the gap by which the bus bars 2 and 5 are spaced from each other, and the platforms 16 and 17 are disposed within the recesses 10 and 13, respectively. This joint form achieves the excellent effect of retaining the molten solder by the recesses 10 and 13, and besides is effective in increasing the solder joint strength.

Although FIGS. 2 to 4 show three different kinds of recess (10 to 13) and solder (15) joint arrangement, all can be formed into any one kind of recess and solder (15) joint arrangement. Two kinds of recess and solder (15) joint arrangements can be used in combination.

The outer surface of each of the fillets of the solder 15 is concave toward the connecting portion 6*t*, 7*t*, 8*t* of the chip part 6, 7, 8 and the recess 10, 11, 12, 13 under the influence of the gravity acting on the molten solder.

In the semi-assembly, which comprises the bus bars 2 to 5 and the chip parts 6 to 8, and is formed by the above solder joint structure, a synthetic resin is molded to cover the chip parts 6 to 8 and their neighboring portions, so that this semi-assembly is used as the chip-like electronic device.

As described above, in the structure according to the invention for joining the chip part to the bus bars, the recesses are formed respectively in the soldering lands of the bus bars each corresponding to the predetermined solder wetting area, and therefore the molten solder is retained in each recess, and will not spread beyond the recess.

Therefore, there can be obtained the electronic device in which the solder joint strength is increased so as to enhance the high reliability of the electronic device, while ensuring the high production efficiency and the low cost.

What is claimed is:

1. A joining structure comprising:

two conductive bus bars spaced from each other;

a chip part including connecting portions for an electric circuit, mounted on the two bus bars;

recesses formed in soldering lands of the two bus bars, respectively, so that the connecting portions are spaced horizontally apart from inner edges of the recesses; and a solder fillet formed between at least part of each of the recesses and the corresponding connecting portion.

2. The joining structure according to claim 1, wherein the connecting portions have a flat plate-like shape on opposite side surfaces of the chip part, and the connecting portions form a part of a bottom surface of the chip part.

3. The joining structure according to claim 1, wherein bottom surfaces of the connecting portions extend inwardly toward each other.

4. The joining structure according to claim 1, wherein each of the recesses includes a flat bottom surface, and the solder fillets are formed in a state that lower surfaces of the connecting portions are held by the bottom surface.

5. The joining structure according to claim 1, wherein the solder fillets are formed in a state that the connecting portions are spaced from bottom surfaces of the recesses, so that a solder layer is formed between the bottom surfaces and a lower surface of the connecting portion.

6. The joining structure according to claim 1, wherein the soldering lands correspond to a predetermined solder wetting area.

7. The joining structure of claim 1, wherein each of the recesses includes a projection platform having a height lower than an upper surface of the bus bars, and the solder fillets are form in a state that lower surfaces of the connecting portions are held by the projection platforms, respectively.

8. The joining structure of claim 1, wherein each of the recesses includes a flat bottom surface, and the solder fillets are formed in a state that lower surfaces of the connecting portions are held against the bottom surface.

9. A joining structure comprising:

two conductive bus bars spaced from each other:

a chip part including connecting portions for an electric circuit, mounted on the two bus bars;

recesses formed in soldering lands of the two bus bars, respectively, so that the connecting portions are spaced apart from inner edges of the recesses; and a solder fillet formed between at least part of each of the recesses and the corresponding connecting portion, wherein each of the recesses includes a projection platform having a height lower than an upper surface of the bus bars, and the solder fillets are form in a state that lower surfaces of the connecting portions are held by the projection platforms, respectively.

10. A joining structure comprising:

two conductive bus bars spaced from each other;

a chip part including connecting portions for an electric circuit, mounted on the two bus bars;

recesses formed in soldering lands of the two bus bars, respectively, so that the connecting portions are spaced apart from inner edges of the recesses; and a solder fillet formed between at least part of each of the recesses and the corresponding connecting portion, wherein each of the recesses includes a flat bottom surface, and the solder fillets are formed in a state that lower surfaces of the connecting portions are held against the bottom surface.

* * * * *